United States Patent
Weil

(10) Patent No.: US 12,401,374 B2
(45) Date of Patent: Aug. 26, 2025

(54) LOAD MATCHING FOR A CURRENT-STEERING DIGITAL-TO-ANALOG CONVERTER

(71) Applicant: QUALCOMM Incorporated, San Diego, CA (US)

(72) Inventor: Andrew Weil, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 176 days.

(21) Appl. No.: 18/189,350

(22) Filed: Mar. 24, 2023

(65) Prior Publication Data
US 2024/0322838 A1     Sep. 26, 2024

(51) Int. Cl.
| | |
|---|---|
| H03M 1/74 | (2006.01) |
| H03M 1/06 | (2006.01) |
| H03M 1/68 | (2006.01) |

(52) U.S. Cl.
CPC .......... H03M 1/742 (2013.01); H03M 1/068 (2013.01); H03M 1/687 (2013.01)

(58) Field of Classification Search
CPC ...... H03M 1/742; H03M 1/068; H03M 1/687; H03M 1/68; H03M 1/745
See application file for complete search history.

(56) References Cited

U.S. PATENT DOCUMENTS

| | | | |
|---|---|---|---|
| 5,933,107 A | 8/1999 | Tan | |
| 6,833,801 B1 * | 12/2004 | Ostrem | H03K 17/04106 341/144 |
| 7,847,717 B2 * | 12/2010 | Mishra | H03M 1/0663 341/120 |
| 8,653,999 B1 * | 2/2014 | Verlinden | H03M 1/662 341/150 |
| 9,548,752 B1 * | 1/2017 | Shrivastava | H03M 1/66 |
| 9,871,531 B1 * | 1/2018 | Fang | H03M 1/68 |
| 10,469,097 B1 * | 11/2019 | Bothra | H03F 3/45188 |
| 10,944,417 B1 | 3/2021 | Lahiri | |
| 11,271,576 B1 * | 3/2022 | Weil | H03M 1/1009 |
| 11,476,859 B1 * | 10/2022 | Agrawal | H03M 1/0617 |
| 11,539,371 B1 * | 12/2022 | Tang | H03M 1/1014 |
| 11,990,916 B2 * | 5/2024 | Agrawal | H03M 1/0863 |
| 2004/0104832 A1 | 6/2004 | Bugeja | |

(Continued)

OTHER PUBLICATIONS

International Search Report and Written Opinion—PCT/US2024/017853—ISA/EPO—Jun. 17, 2024.

*Primary Examiner* — Lam T Mai

(74) *Attorney, Agent, or Firm* — Patterson + Sheridan, L.L.P.

(57) ABSTRACT

Certain aspects of the present disclosure are directed towards a digital-to-analog converter (DAC) system. The DAC system generally includes a first driver and a plurality of current-steering cells. A first current-steering cell of the plurality of current-steering cells includes: a first current source coupled to a first current-steering transistor and a second current-steering transistor, wherein a gate of the first current-steering transistor and a gate of the second current-steering transistor are coupled to a first output and a second output of the first driver, respectively; a first transistor having a source coupled to a current source path and a drain coupled to a reference potential node; and a second transistor having a source coupled to the current source path and a drain coupled to the reference potential node.

20 Claims, 7 Drawing Sheets

(56) References Cited

U.S. PATENT DOCUMENTS

| | | | | |
|---|---|---|---|---|
| 2007/0090981 A1* | 4/2007 | Chou | ............... | H03M 1/68 |
| | | | | 341/144 |
| 2015/0048960 A1* | 2/2015 | Zhu | ............... | H03M 1/66 |
| | | | | 341/144 |
| 2020/0358452 A1* | 11/2020 | Wong | ............... | H03M 1/0678 |
| 2022/0416804 A1* | 12/2022 | Mehdizad Taleie | .. | H03M 1/466 |
| 2023/0403022 A1* | 12/2023 | Zhou | ............... | H03M 1/1009 |
| 2024/0007125 A1* | 1/2024 | Fei | ............... | H03M 1/08 |
| 2024/0113727 A1* | 4/2024 | Egan | ............... | H03M 1/742 |

\* cited by examiner

700 ⬅

RECEIVE, AT A FIRST DRIVER OF A DIGITAL-TO-ANALOG CONVERTER (DAC), A FIRST DIGITAL INPUT VIA AN INPUT PATH OF THE DAC

702

GENERATE AN ANALOG OUTPUT SIGNAL BASED ON THE FIRST DIGITAL INPUT BY CONTROLLING, VIA THE FIRST DRIVER, A FIRST CURRENT-STEERING TRANSISTOR AND A SECOND CURRENT-STEERING TRANSISTOR OF A FIRST CURRENT-STEERING CELL OF A PLURALITY OF CURRENT-STEERING CELLS BASED ON THE FIRST DIGITAL INPUT, THE FIRST CURRENT-STEERING CELL HAVING A FIRST CURRENT SOURCE COUPLED TO THE FIRST CURRENT-STEERING TRANSISTOR AND THE SECOND CURRENT-STEERING TRANSISTOR, WHEREIN THE FIRST CURRENT-STEERING CELL FURTHER COMPRISES A FIRST TRANSISTOR HAVING A SOURCE COUPLED TO A CURRENT SOURCE PATH, A DRAIN COUPLED TO A REFERENCE POTENTIAL NODE, AND A GATE COUPLED TO THE FIRST DRIVER AND A SECOND TRANSISTOR HAVING A SOURCE COUPLED TO THE CURRENT SOURCE PATH, A DRAIN COUPLED TO THE REFERENCE POTENTIAL NODE, AND A GATE COUPLED TO THE FIRST DRIVER

LOAD MATCHING FOR A CURRENT-STEERING DIGITAL-TO-ANALOG CONVERTER

BACKGROUND

Field of the Disclosure

Certain aspects of the present disclosure generally relate to electronic components and, more particularly, to circuitry for digital-to-analog conversion.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include one or more digital-to-analog converters (DACs) configured to convert signals from the digital domain to the analog domain for further processing (e.g., amplification) prior to transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a digital-to-analog converter (DAC) system. The DAC system generally includes a first driver and a plurality of current-steering cells. A first current-steering cell of the plurality of current-steering cells comprises: a first current source coupled to a first current-steering transistor and a second current-steering transistor, wherein a gate of the first current-steering transistor and a gate of the second current-steering transistor are coupled to a first output and a second output of the first driver, respectively; a first transistor having a source coupled to a current source path, a drain coupled to a reference potential node, and a gate coupled to the first output of the first driver; and a second transistor having a source coupled to the current source path, a drain coupled to the reference potential node, and a gate coupled to the second output of the first driver.

Certain aspects of the present disclosure are directed towards a method for digital-to-analog conversion. The method generally includes: receiving, at a first driver of a DAC, a first digital input via an input path of the DAC; and generating an analog output signal based on the first digital input by controlling, via the first driver, a first current-steering transistor and a second current-steering transistor of a first current-steering cell of a plurality of current-steering cells based on the first digital input, the first current-steering cell having a first current source coupled to the first current-steering transistor and the second current-steering transistor. The first current-steering cell further comprises: a first transistor having a source coupled to a current source path, a drain coupled to a reference potential node, and a gate coupled to the first driver; and a second transistor having a source coupled to the current source path, a drain coupled to the reference potential node, and a gate coupled to the first driver.

Certain aspects of the present disclosure are directed towards an apparatus for digital-to-analog conversion. The apparatus generally includes: means for receiving a first digital input; and a first current-steering cell of a plurality of current-steering cells coupled to the means for receiving, wherein the means for receiving includes means for controlling a first current-steering transistor and a second current-steering transistor of the first current-steering cell based on the first digital input, the first current-steering cell having a first current source coupled to the first current-steering transistor and the second current-steering transistor. The first current-steering cell further comprises: a first transistor having a source coupled to a current source path, a drain coupled to a reference potential node, and a gate coupled to the means for controlling; and a second transistor having a source coupled to the current source path, a drain coupled to the reference potential node, and a gate coupled to the means for controlling.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 7 is a flow diagram depicting example operations for digital-to-analog conversion, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques and apparatus for digital-to-analog conversion. For example, certain aspects provide a digital-to-analog converter (DAC) including current-steering cells implemented with an architecture that reduces timing skew errors across DAC segmentation boundaries. Timing skew errors degrade the noise floor and out-of-band DAC emissions. The timing skew errors may be reduced by connecting dummy transistors to switch driver outputs, as described in more detail herein.

Example Wireless Communications

Figure 1:
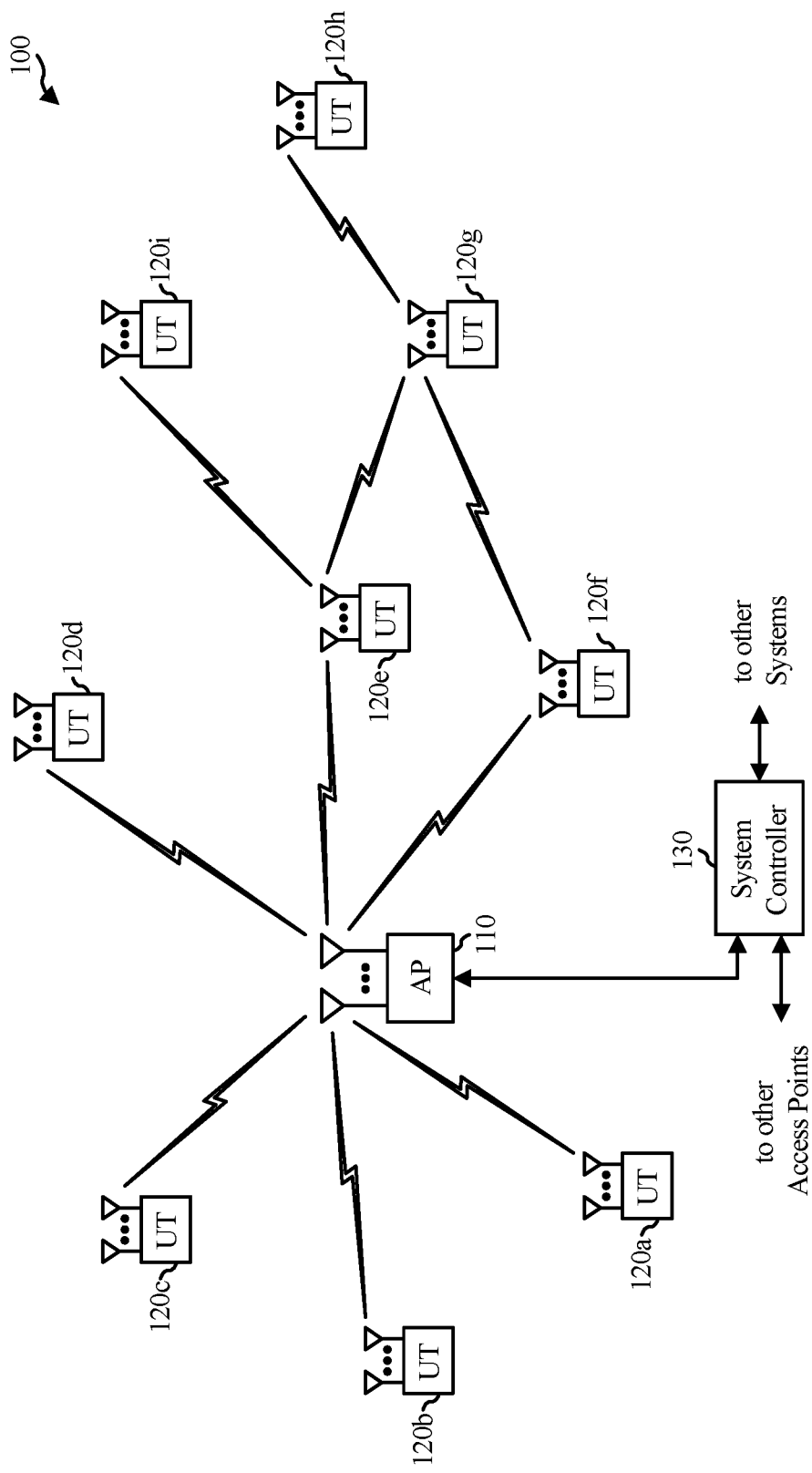
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a digital-to-analog converter (DAC) having current-steering cells implemented with an architecture for reducing timing skew errors, as described in more detail herein.

Figure 2:
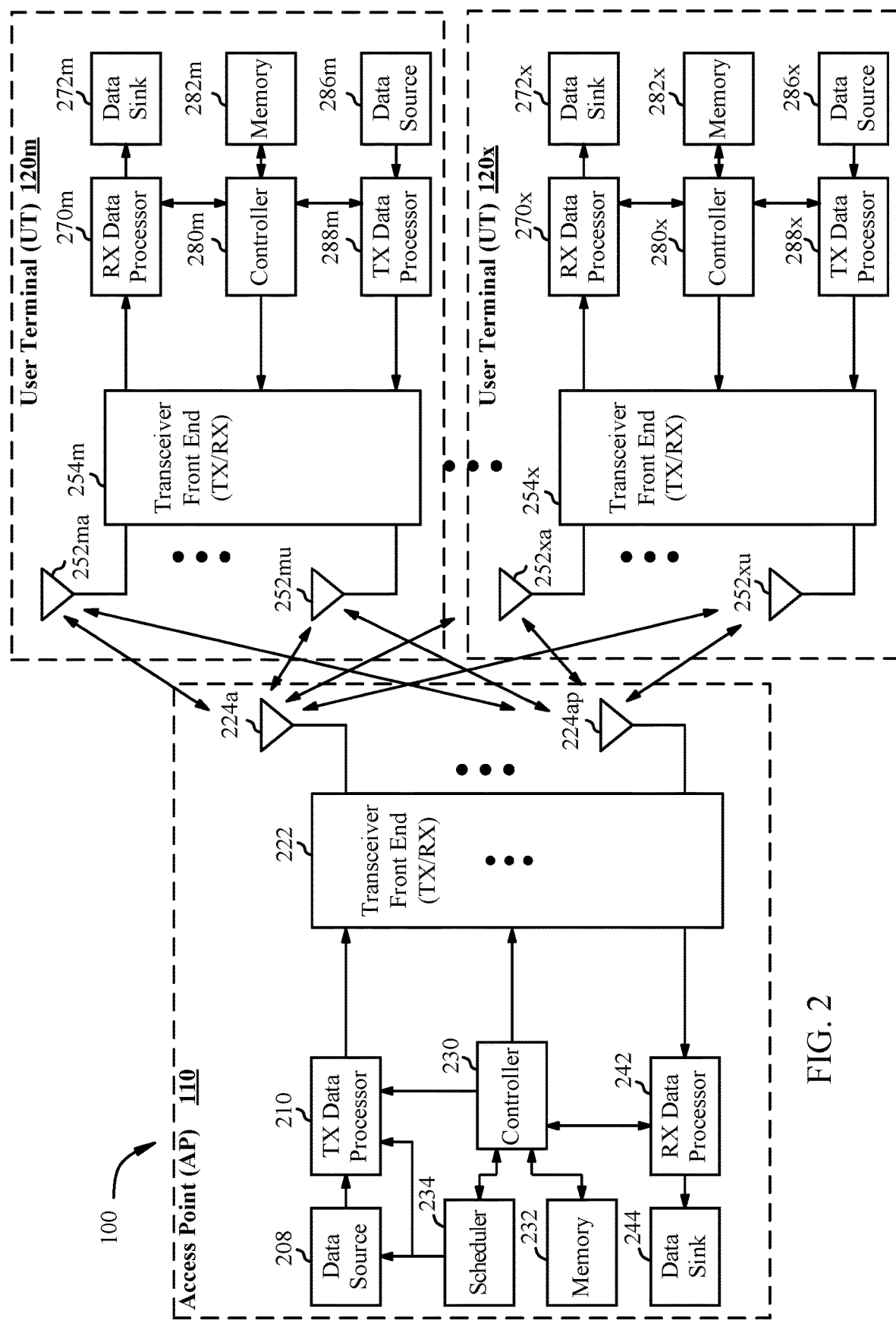
FIG. 2 is a block diagram of an example access point (AP) and example user terminals, in which aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a transmitter (TX) data processor 288 receives traffic data from a data source 286 and control data from a controller 280. TX data processor 288 processes (e.g., encodes, interleaves, and modulates) the traffic data {dup} for the user terminal based on the coding and modulation schemes associated with the rate selected for the user terminal and provides a data symbol stream {sup} for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream {Sup} transmitted by a user terminal. A receiver (RX) data processor 242 processes (e.g., demodulates, deinterleaves, and decodes) the recovered uplink data symbol stream in accordance with the rate used for that stream to obtain decoded data. The decoded data for each user terminal may be provided to a data sink (e.g., data sink 272m or data sink 272x, with corresponding data sink 244 for access point 110) for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include a DAC having current-steering cells implemented with an architecture for reducing timing skew errors, as described in more detail herein.

Figure 3:
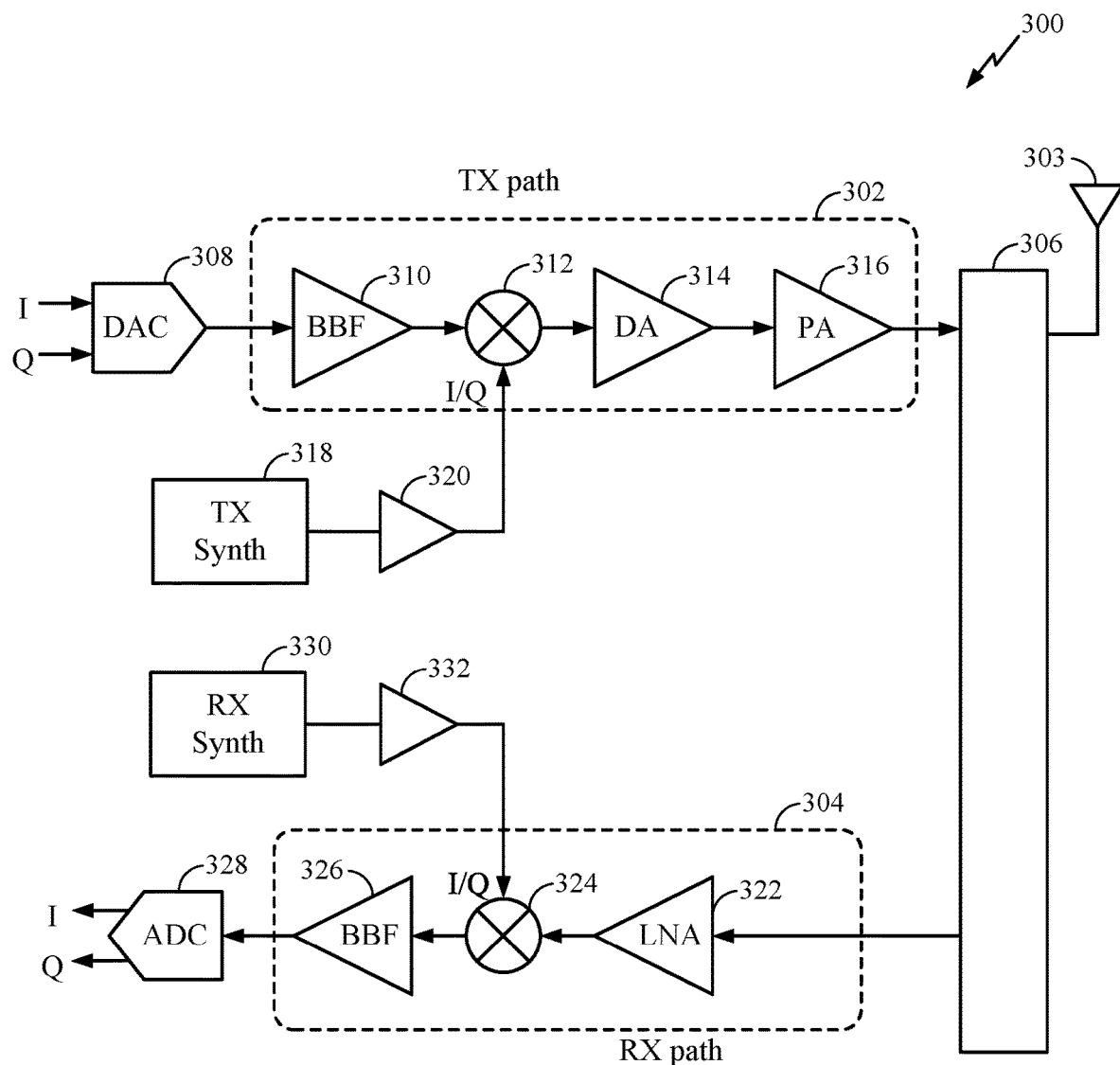
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a "transmit chain") for transmitting signals via one or more antennas and a receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In some cases, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission. In some aspects, the DAC 308 may include current-steering cells implemented with an architecture for reducing timing skew errors, as described in more detail herein.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 describe wireless communications as an example application in which certain aspects of the present disclosure may be implemented to facilitate understanding, certain aspects described herein may be used for digital-to-analog conversion in any of various other suitable applications (e.g., high-speed serializer/deserializer (SerDes) systems).

Digital-to-Analog Conversion Using Current Steering

Current-steering digital-to-analog converters (DACs) are the architecture of choice for high-performance digital-to-analog conversion in many wireless transmitters. Current-steering DACs offer versatility of design, allow high-speed operation, and provide high performance. In some cases, a segmented DAC may have different current-steering segments for processing of most-significant bits (MSBs) and least-significant bits (LSBs) of a digital input code. Some segmented DACs may suffer from timing errors across segmentation boundaries, creating short pulses in drive signals that provide wide bandwidth signal content causing increased noise floor and large out-of-band emission. Certain aspects provide a DAC architecture that reduces timing mismatch across DAC segmentation boundaries.

Figure 4:
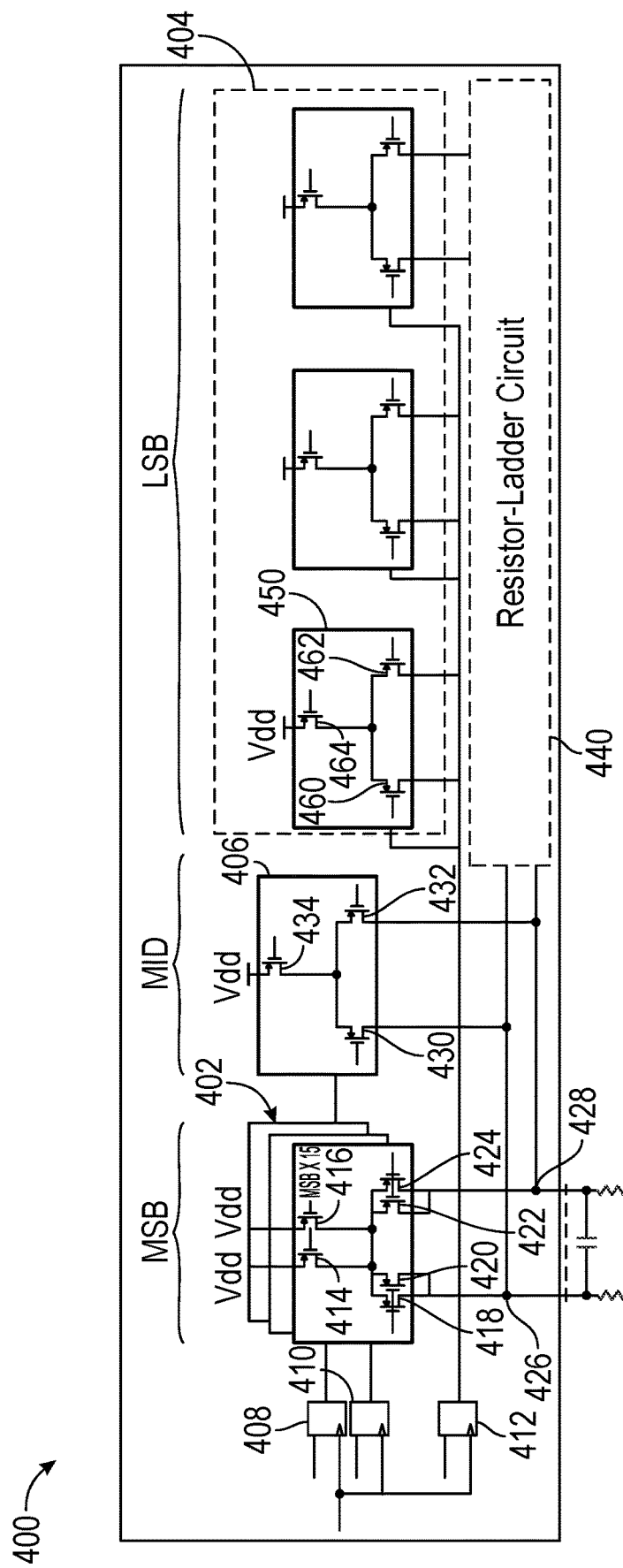
FIG. 4 illustrates an example digital-to-analog converter (DAC), in accordance with certain aspects of the present disclosure.

FIG. 4 illustrates an example current-steering DAC 400 (e.g., corresponding to DAC 308 of FIG. 3), in accordance with certain aspects of the present disclosure. Depending on a digital input code, each bit of the DAC 400 associated with a current-steering cell may cause sourcing of a positive current or a negative current to respective outputs according to the logic level for a respective bit of the digital input code. A "positive current" from a current-steering cell generally refers to a current provided to a positive output node (e.g., positive output node 426), and a "negative current" from a current-steering cell generally refers to a current provided to a negative output node (e.g., negative output node 428). Each of the current-steering cells may include switches (referred to herein as current-steering switches or transistors) to selectively provide a positive or a negative current to respective output nodes.

As shown, the DAC 400 includes multiple current-steering cells, including most-significant bit (MSB) current-steering cells 402 used to process the MSBs of a digital input code of the DAC system, and least-significant bit (LSB) current-steering cells 404 used to process the LSBs of the digital input code. In some aspects, the DAC 400 may also include a middle (MID) current-steering cell (e.g., for a bit having a significance between the MSBs and LSBs). The LSB current-steering cells 404 may be coupled to a resistor-ladder circuit 440. The resistor-ladder circuit 440 provides different weights associated with the LSB bits processed via the LSB current-steering cells 404. As shown, drivers 408 may drive the current-steering transistors of the MSB current-steering cells 402, driver 410 may drive the current-steering transistors of the current-steering cell 406, and drivers 412 may drive the current-steering transistors of the current-steering cells 404.

As shown, each of the MSB current-steering cells 402 includes two current sources (e.g., p-channel metal-oxide-semiconductor (PMOS) transistors 414, 416) that are coupled to at least two positive current-steering transistors (e.g., PMOS transistors 418, 420) providing positive current to the positive output node 426) and at least two negative current-steering transistors (e.g., PMOS transistors 422, 424 providing negative current to the negative output node 428). The sources of the PMOS transistors 418, 420, 422, 424 may be coupled together and coupled to the drains of the PMOS transistors 414, 416. The PMOS transistors 418, 420, 422, 424 may be referred to herein as current-steering transistors. The drains of the PMOS transistors 418, 420 are coupled to the positive output node 426, and the drains of the PMOS transistors 422, 424 are coupled to the negative output node 428, as shown.

Each of the LSB current-steering cells 404 and the MID current-steering cell 406 may include fewer positive current-steering transistors and fewer negative current-steering transistors, as compared to each of the MSB current-steering cells 402. For instance, the MID current-steering cell 406 may include a single positive current-steering transistor (e.g., PMOS transistor 430) and a single negative current-steering transistor (e.g., PMOS transistor 432), as opposed to the MSB current-steering cells 402 that each include two positive current-steering transistors and two negative current-steering transistors. The sources of PMOS transistors 430, 432 may be coupled to a drain of PMOS transistor 434 used to implement a current source for the current-steering cell 406. Each of the LSB current-steering cells 404 may be implemented similarly to the MID current-steering cell 406. For instance, the LSB current-steering cell 450 may include a positive current-steering transistor (e.g., PMOS transistor 460) and a negative current-steering transistor (e.g., PMOS transistor 462). The sources of PMOS transistors 460, 462 may be coupled to a drain of PMOS transistor 464 used to implement a current source for the current-steering cell 450.

As each of the MID and LSB current-steering cells includes fewer positive and negative current-steering transistors, the capacitive load for each of the drivers 408 may not be matched with the capacitive load for driver 410 or each of drivers 412, causing a timing mismatch when driving the different current-steering cells. This timing mismatch causes timing skew errors across the DAC segmentation boundaries (e.g., a timing mismatch associated with digital outputs used to drive the current-steering cells 402 and current-steering cell 406).

In some implementations, switch drivers may be redesigned to have different output drive capacities to match the driver outputs' timings. However, this technique is challenging to track over process, voltage, and temperature (PVT) variations and causes harmonic distortion and increased noise floor. In some aspects of the present disclosure, non-conducting dummy transistors coupled to driver outputs may be used to match the capacitive loads of the drivers, as described in more detail herein.

Figure 5:
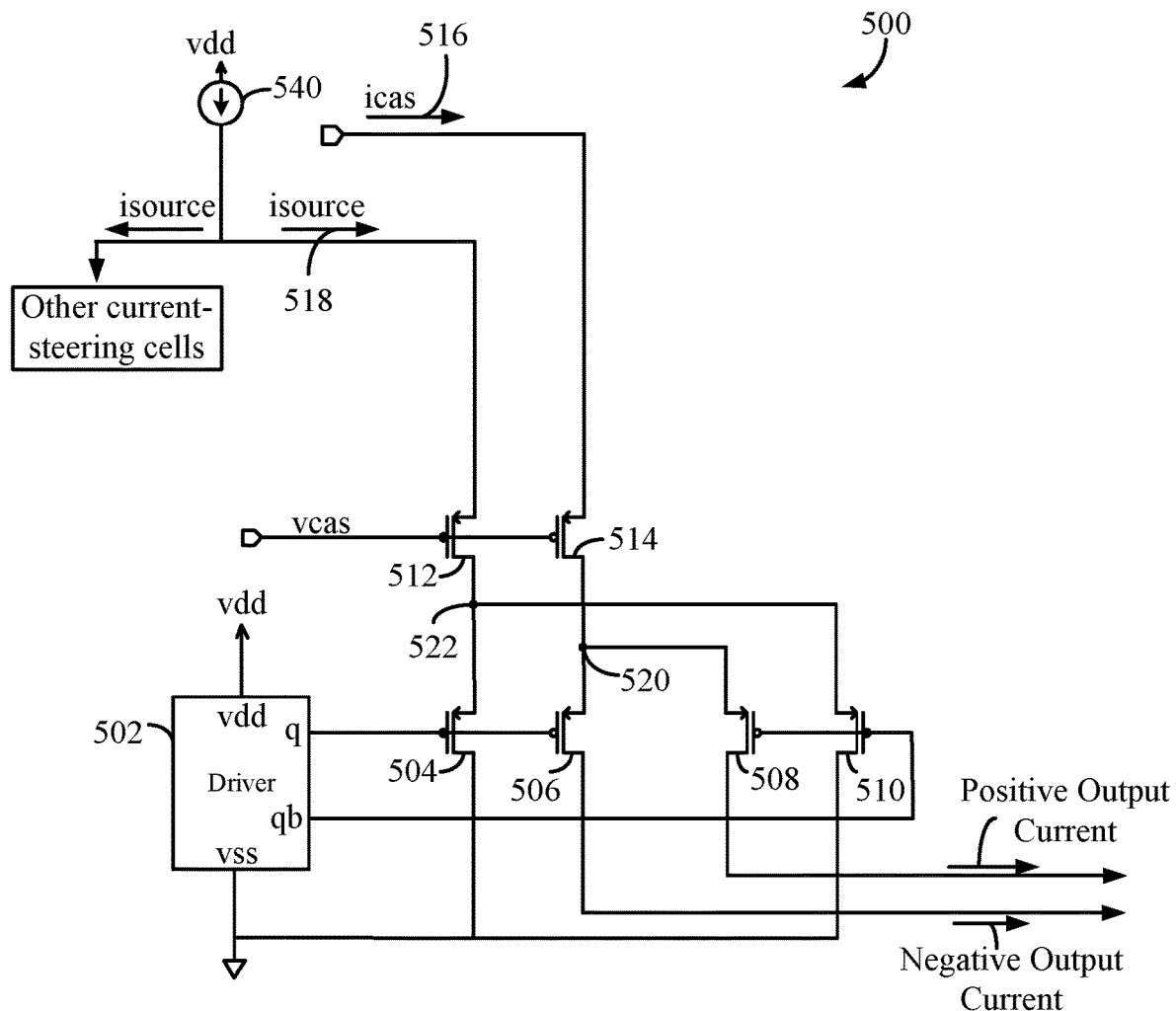
FIG. 5 and FIG. 6 illustrate example current-steering cells, in accordance with certain aspects of the present disclosure.

FIG. 5 illustrates an example current-steering cell 500, in accordance with certain aspects of the present disclosure. The current-steering cell 500 may correspond to the current-steering cell 406, or any one of current-steering cells 404, such as current-steering cell 450. As shown, the current-steering cell 500 includes a PMOS transistor 506 (e.g., corresponding to PMOS transistor 430 of current-steering cell 406 or PMOS transistor 460 of current-steering cell 450) and a PMOS transistor 508 (e.g., corresponding to PMOS transistor 432 of current-steering cell 406 or PMOS transistor 462 of current-steering cell 450).

The current-steering cell 500 may also include a PMOS transistor 514 which may be operated in saturation. A cascade current 516 (icas) may be provided to node 520 coupled to sources of transistors 506, 508, through PMOS transistor 514 (e.g., from source to drain of PMOS transistor 514). Icas may be provided via the current source (e.g., PMOS transistor 434) of the current-steering cell 406 or the current source (e.g., PMOS transistor 464) of the current-steering cell 450. As shown, a driver 502 (e.g., corresponding to one of drivers 412 or driver 410) may be used to drive the gates of PMOS transistors 506, 508. For instance, a digital output (q) may be used to drive the gate of the PMOS transistor 506, and a complementary digital output (qb) may be used to drive the gate of PMOS transistor 508.

In some aspects, in an attempt to match the load of driver 502 with the load of each of drivers 408, the driver 502 may also drive the gate of a PMOS transistor 504 and the gate of a PMOS transistor 510. The drains of PMOS transistors 504, 510 are coupled to a reference potential node (e.g., electrical ground or vss, or any potential node that configures transistors 504, 510 in saturation). The sources of PMOS transistors 504, 510 are coupled to a drain of a PMOS transistor 512. When the digital output (q) of the driver 502 is logic low, the PMOS transistor 504 is effectively configured as a diode-connected transistor (e.g., since the gate and the drain of the PMOS transistor 504 are at the same voltage potential), and when the complementary digital output (qb) of the driver 502 is logic low, the PMOS transistor 510 is effectively configured as a diode-connected transistor (e.g., since the gate and the drain of the PMOS transistor 510 are at the same voltage potential).

The gates of PMOS transistors 512, 514 are biased using a cascade voltage (vcas), as shown. The PMOS transistors 512, 514 may be operated in saturation. A source current 518 (isource) may be provided to node 522 coupled to sources of PMOS transistors 504, 510. The source current 518 may also be referred to as bleeder current. As such, the current-steering cell 500 may be referred to as a current bleeder-based steering cell. Source current 518 may be provided through transistor 512 (e.g., from the source to the drain of transistor 512). The source current 518 may be provided via a current source 540. The PMOS transistor 512 reduces the impact of the line capacitance on the source side of the PMOS transistor 512 to the capacitance on the drain side of the PMOS transistor 512.

As shown, the current source 540 may also provide a source current to one or more other current-steering cells. The input impedance looking into the gates of the transistors 504, 510 may be fairly constant over a wide range of bias currents (e.g., when the transistors 504, 510 are in saturation). The current-steering cells may not be sensitive to small variations in the bias currents across the steering cells, allowing a single current source 540 to be used for providing bias currents for multiple current-steering cells, as described.

With the PMOS transistors 504, 510, the load mismatch across the drivers may be reduced with a relatively small amount of increase in static power consumption for the DAC 400. Moreover, the techniques described herein for reducing load mismatch provide an improved noise floor as compared to conventional implementations.

Figure 6:
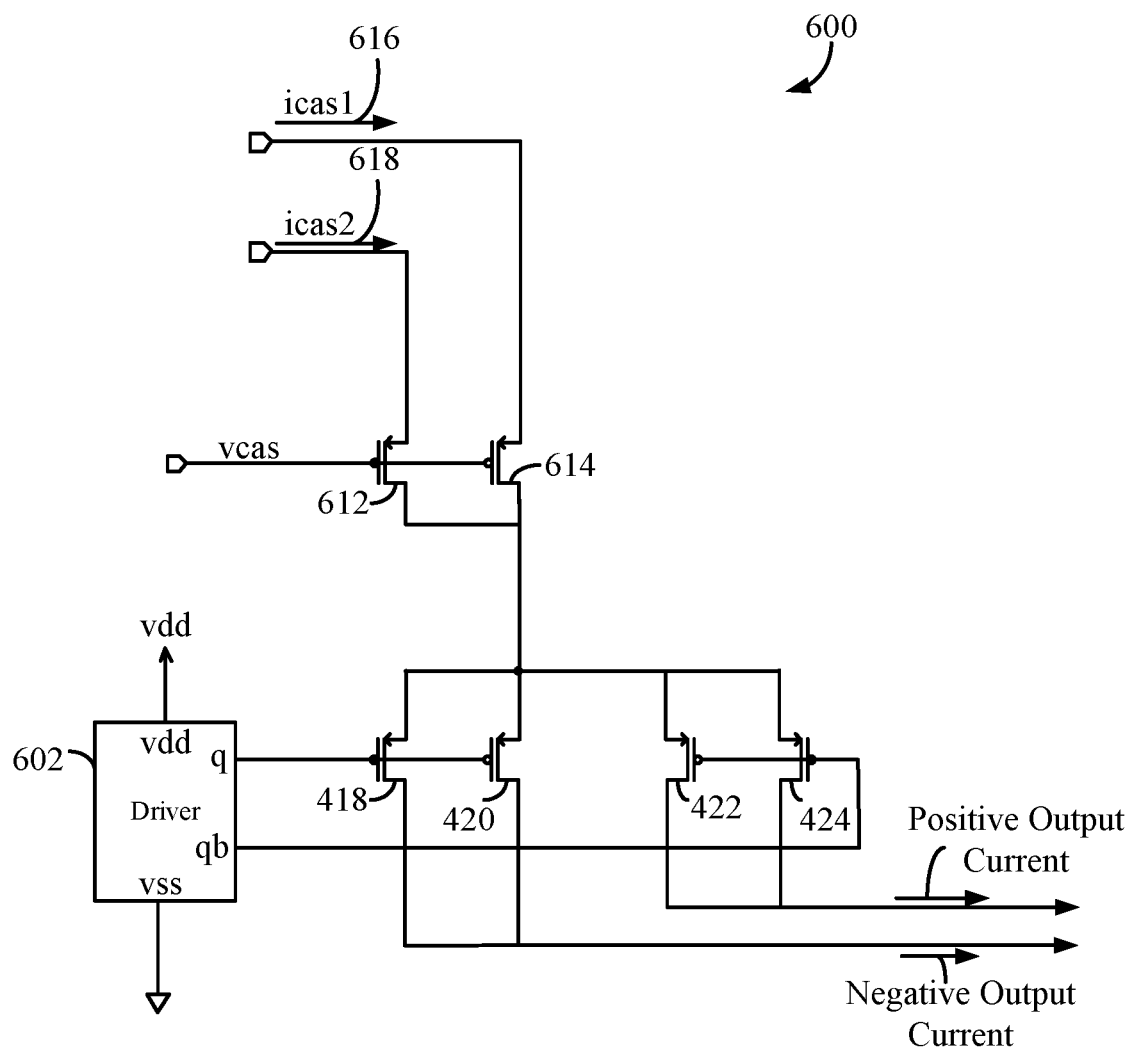

FIG. 6 illustrates an example current-steering cell 600, in accordance with certain aspects of the present disclosure. The current-steering cell 600 may correspond to any one of the MSB current-steering cells 402. As shown, cascade current 616 (icas1) and cascade current 618 (icas2) are provided via respective current sources (e.g., PMOS transistor 414 and PMOS transistor 416). The current-steering cell 600 may include a PMOS transistor 612 and a PMOS transistor 614. The cascade current 616 may be received at a source of the PMOS transistor 614 and the cascade current 618 may be received at a source of the PMOS transistor 612. The drains of the PMOS transistor 612 and the PMOS transistor 614 may be coupled together and coupled to the sources of PMOS transistors 418, 420, 422, 424. The PMOS transistors 612, 614 may be biased in saturation using a cascade voltage (vcas), as shown. The gates of the PMOS transistors 418, 420, 422, 424 may be driven using a driver 602. Driver 602 may correspond to one of the drivers 408.

FIG. 7 is a flow diagram depicting example operations 700 for digital-to-analog conversion, in accordance with certain aspects of the present disclosure. For example, the operations 700 may be performed by a DAC, such as the DAC 400.

The operations 700 begin, at block 702, with the DAC receiving, at a first driver (e.g., driver 502 corresponding to driver 410 or driver 412) of the DAC, a first digital input via an input path of the DAC. At block 704, the DAC generates an analog output signal based on the first digital input by controlling, via the first driver, a first current-steering transistor (e.g., PMOS transistor 504) and a second current-steering transistor (e.g., PMOS transistor 508) of a first current-steering cell (e.g., current-steering cell 500, corresponding to current-steering cell 406 or current-steering cell 450) of a plurality of current-steering cells based on the first digital input. The first current-steering cell may have a first current source (e.g., PMOS transistor 434 or PMOS transistor 464) coupled to the first current-steering transistor and the second current-steering transistor.

In some aspects of the present disclosure, the first current-steering cell may also include a first transistor (e.g., PMOS transistor 504) having a source coupled to a current source path (e.g., path providing source current 518), a drain coupled to a reference potential node (e.g., vss), and a gate coupled to the first driver. The first current-steering cell may also include a second transistor (e.g., transistor 510) having a source coupled to the current source path, a drain coupled to the reference potential node, and a gate coupled to the first driver.

In some aspects, the DAC also receives, via a third transistor (e.g., transistor 512) of the current source path, a first current (e.g., source current 518) at a source of the third transistor, a drain of the third transistor being coupled to sources of the first transistor and the second transistor. The DAC may provide a second current via a second current source (e.g., current source 540). The first current may include a first portion of the second current, a second portion of the second current being provided to a second current-steering cell of the plurality of current-steering cells. In some aspects, the first current-steering cell may also include a fourth transistor (e.g., transistor 514) coupled between the first current source and a current-steering node (e.g., node 520), the current-steering node being coupled to sources of the first current-steering transistor and the second current-steering transistor. A gate of the fourth transistor may be coupled to a gate of the third transistor.

In some aspects, the DAC may also provide, via the first current-steering transistor, a first output current to a first output (e.g., positive output node 426) of the DAC, a drain of the first current-steering transistor being coupled to the first output of the DAC. The DAC may provide, via the second current-steering transistor, a second output current to a second output (e.g., negative output node 428) of the DAC, a drain of the second current-steering transistor being coupled to the second output of the DAC.

In some aspects, the DAC may receive, at a second driver (e.g., driver 408) of the DAC, a second digital input via the input path of the DAC. The DAC may generate the analog output signal based on the second digital input by controlling, via the second driver, a third current-steering transistor (e.g., PMOS transistor 420) and a fourth current-steering transistor (e.g., PMOS transistor 422) of a second current-steering cell (e.g., current-steering cell 402) of the plurality of current-steering cells based on the second digital input. The second current-steering cell may include a second current source (e.g., PMOS transistor 414 or PMOS transistor 416) coupled to the third current-steering transistor and the fourth current-steering transistor. In some aspects, the second current-steering cell may include a fifth current-steering transistor (e.g., PMOS transistor 418) having a source coupled to the second current source and a sixth current-steering transistor (e.g., PMOS transistor 424) having a source coupled to the second current source. A gate of the fifth current-steering transistor and a gate of the sixth current-steering transistor may be coupled to a first output and a second output of the second driver, respectively. In some aspects, the first digital input (e.g., one of the LSBs or a bit processed by current-steering cell 406) has a lower significance than the second digital input (e.g., MSB). A first load impedance for the first driver may be configured to match a second load impedance for the second driver. The first load impedance may be associated with the first current-steering cell and the second load impedance is associated with the second current-steering cell.

In some aspects, drains of the first current-steering transistor and the second current-steering transistor may be coupled to a resistor-ladder circuit (e.g., resistor-ladder circuit 440). The first current-steering transistor, the second current-steering transistor, the first transistor, and the second transistor may include PMOS transistors.

Example Aspects

In addition to the various aspects described above, specific combinations of aspects are within the scope of the disclosure, some of which are detailed below:

Aspect 1. A digital-to-analog converter (DAC) system, comprising: a first driver; and a plurality of current-steering cells, wherein a first current-steering cell of the plurality of current-steering cells comprises: a first current source coupled to a first current-steering transistor and a second current-steering transistor, wherein a gate of the first current-steering transistor and a gate of the second current-steering transistor are coupled to a first output and a second output of the first driver, respectively; a first transistor having a source coupled to a current source path, a drain coupled to a reference potential node, and a gate coupled to the first output of the first driver; and a second transistor having a source coupled to the current source path, a drain coupled to the reference potential node, and a gate coupled to the second output of the first driver.

Aspect 2. The DAC system of aspect 1, wherein the current source path comprises a third transistor configured to receive a first current at a source of the third transistor, a drain of the third transistor being coupled to the sources of the first transistor and the second transistor.

Aspect 3. The DAC system of aspect 2, further comprising a second current source configured to provide a second current, wherein the first current comprises a first portion of the second current, a second portion of the second current being provided to a second current-steering cell of the plurality of current-steering cells.

Aspect 4. The DAC system of any one of aspects 2-3, wherein the first current-steering cell further comprises a fourth transistor coupled between the first current source and a current-steering node, the current-steering node being coupled to sources of the first current-steering transistor and the second current-steering transistor.

Aspect 5. The DAC system of aspect 4, wherein a gate of the fourth transistor is coupled to a gate of the third transistor.

Aspect 6. The DAC system of any one of aspects 1-5, wherein: a drain of the first current-steering transistor is coupled to a first output of the DAC system; and a drain of the second current-steering transistor is coupled to a second output of the DAC system.

Aspect 7. The DAC system of any one of aspects 1-6, wherein a second current-steering cell of the plurality of current-steering cells comprises: a second current source; a third current-steering transistor having a source coupled to the second current source; and a fourth current-steering transistor having a source coupled to the second current source, wherein a gate of the third current-steering transistor and a gate of the fourth current-steering transistor are coupled to a first output and a second output of a second driver, respectively.

Aspect 8. The DAC system of aspect 7, wherein the second current-steering cell further comprises: a fifth current-steering transistor having a source coupled to the second current source; and a sixth current-steering transistor having a source coupled to the second current source, wherein a gate of the fifth current-steering transistor and a gate of the sixth current-steering transistor are coupled to the first output and the second output of the second driver, respectively.

Aspect 9. The DAC system of any one of aspects 7-8, wherein: the first current-steering cell is configured to process a first bit of a digital input code of the DAC system; and the second current-steering cell is configured to process a second bit of a digital input code of the DAC system, the first bit having a lower significance than the second bit.

Aspect 10. The DAC system of any one of aspects 7-9, wherein: a first load impedance for the first driver is configured to match a second load impedance for the second driver; the first load impedance is associated with the first current-steering cell; and the second load impedance is associated with the second current-steering cell.

Aspect 11. The DAC system of any one of aspects 1-10, wherein drains of the first current-steering transistor and the second current-steering transistor are coupled to a resistor-ladder circuit.

Aspect 12. The DAC system of any one of aspects 1-11, wherein the first current-steering transistor, the second current-steering transistor, the first transistor, and the second transistor comprise p-channel metal-oxide-semiconductor (PMOS) transistors.

Aspect 13. A method for digital-to-analog conversion, comprising: receiving, at a first driver of a digital-to-analog converter (DAC), a first digital input via an input path of the DAC; generating an analog output signal based on the first digital input by controlling, via the first driver, a first current-steering transistor and a second current-steering transistor of a first current-steering cell of a plurality of current-steering cells based on the first digital input, the first current-steering cell having a first current source coupled to the first current-steering transistor and the second current-steering transistor, wherein the first current-steering cell further comprises: a first transistor having a source coupled to a current source path, a drain coupled to a reference potential node, and a gate coupled to the first driver; and a second transistor having a source coupled to the current source path, a drain coupled to the reference potential node, and a gate coupled to the first driver.

Aspect 14. The method of aspect 13, further comprising receiving, via a third transistor of the current source path, a first current at a source of the third transistor, a drain of the third transistor being coupled to the sources of the first transistor and the second transistor.

Aspect 15. The method of aspect 14, further comprising providing a second current via a second current source, wherein the first current comprises a first portion of the second current, a second portion of the second current being provided to a second current-steering cell of the plurality of current-steering cells.

Aspect 16. The method of any one of aspects 14-15, wherein the first current-steering cell further comprises a fourth transistor coupled between the first current source and a current-steering node, the current-steering node being coupled to sources of the first current-steering transistor and the second current-steering transistor.

Aspect 17. The method of aspect 16, wherein a gate of the fourth transistor is coupled to a gate of the third transistor.

Aspect 18. The method of any one of aspects 13-17, further comprising: providing, via the first current-steering transistor, a first output current to a first output of the DAC, a drain of the first current-steering transistor being coupled to the first output of the DAC; and providing, via the second current-steering transistor, a second output current to a second output of the DAC, a drain of the second current-steering transistor being coupled to the second output of the DAC.

Aspect 19. The method of any one of aspects 13-18, further comprising: receiving, at a second driver of the DAC, a second digital input via the input path of the DAC; and generating the analog output signal based on the second digital input by controlling, via the second driver, a third current-steering transistor and a fourth current-steering transistor of a second current-steering cell of the plurality of current-steering cells based on the second digital input, the second current-steering cell having a second current source coupled to the third current-steering transistor and the fourth current-steering transistor.

Aspect 20. The method of aspect 19, wherein the second current-steering cell comprises: a fifth current-steering transistor having a source coupled to the second current source; and a sixth current-steering transistor having a source coupled to the second current source, wherein a gate of the fifth current-steering transistor and a gate of the sixth current-steering transistor are coupled to a first output and a second output of the second driver, respectively.

Aspect 21. The method of any one of aspects 19-20, wherein the first digital input has a lower significance than the second digital input.

Aspect 22. The method of any one of aspects 19-21, wherein: a first load impedance for the first driver is configured to match a second load impedance for the second driver; the first load impedance is associated with the first current-steering cell; and the second load impedance is associated with the second current-steering cell.

Aspect 23. The method of any one of aspects 13-22, wherein drains of the first current-steering transistor and the second current-steering transistor are coupled to a resistor-ladder circuit.

Aspect 24. The method of any one of aspects 13-23, wherein the first current-steering transistor, the second current-steering transistor, the first transistor, and the second transistor comprise p-channel metal-oxide-semiconductor (PMOS) transistors.

Aspect 25. An apparatus for digital-to-analog conversion, comprising: means for receiving a first digital input; and a first current-steering cell of a plurality of current-steering cells coupled to the means for receiving, wherein the means for receiving includes means for controlling a first current-steering transistor and a second current-steering transistor of the first current-steering cell based on the first digital input, the first current-steering cell having a first current source coupled to the first current-steering transistor and the second current-steering transistor, wherein the first current-steering cell further comprises: a first transistor having a source coupled to a current source path, a drain coupled to a reference potential node, and a gate coupled to the means for controlling; and a second transistor having a source coupled to the current source path, a drain coupled to the reference potential node, and a gate coupled to the means for controlling.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The apparatus and methods described in the detailed description are illustrated in the accompanying drawings by various blocks, modules, components, circuits, steps, processes, algorithms, etc. (collectively referred to as "elements"). The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, means for receiving and means for controlling may include a driver, such as the driver 410 or drivers 412.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A digital-to-analog converter (DAC) system, comprising:
   a first driver; and
   a plurality of current-steering cells, wherein a first current-steering cell of the plurality of current-steering cells comprises:
      a second current source configured to provide a second current, a first portion of the second current provided by a first current source and a second portion of the second current provided to a second current-steering cell of the plurality of current-steering cells;
      the first current source coupled to a first current-steering transistor and a second current-steering transistor, wherein a gate of the first current-steering transistor and a gate of the second current-steering transistor are coupled to a first output and a second output of the first driver, respectively;
      a first transistor having a source coupled to a current source path, a drain coupled to a reference potential node, and a gate coupled to the first output of the first driver;
      a second transistor having a source coupled to the current source path, a drain coupled to the reference potential node, and a gate coupled to the second output of the first driver; and
      a third transistor configured to receive a first current at a source of the third transistor, a drain of the third transistor being coupled to the sources of the first transistor and the second transistor.

2. The DAC system of claim 1, wherein the first current-steering cell further comprises a fourth transistor coupled between the first current source and a current-steering node, the current-steering node being coupled to sources of the first current-steering transistor and the second current-steering transistor.

3. The DAC system of claim 2, wherein a gate of the fourth transistor is coupled to a gate of the third transistor.

4. The DAC system of claim 1, wherein:
   a drain of the first current-steering transistor is coupled to a first output of the DAC system; and
   a drain of the second current-steering transistor is coupled to a second output of the DAC system.

5. The DAC system of claim 1, wherein the second current-steering cell of the plurality of current-steering cells comprises:
   a third current-steering transistor having a source coupled to the second current source; and
   a fourth current-steering transistor having a source coupled to the second current source, wherein a gate of the third current-steering transistor and a gate of the fourth current-steering transistor are coupled to a first output and a second output of a second driver, respectively.

6. The DAC system of claim 5, wherein the second current-steering cell further comprises:
   a fifth current-steering transistor having a source coupled to the second current source; and
   a sixth current-steering transistor having a source coupled to the second current source, wherein a gate of the fifth current-steering transistor and a gate of the sixth current-steering transistor are coupled to the first output and the second output of the second driver, respectively.

7. The DAC system of claim 5, wherein:
   the first current-steering cell is configured to process a first bit of a digital input code of the DAC system; and
   the second current-steering cell is configured to process a second bit of a digital input code of the DAC system, the first bit having a lower significance than the second bit.

8. The DAC system of claim 5, wherein:
   a first load impedance for the first driver is configured to match a second load impedance for the second driver;
   the first load impedance is associated with the first current-steering cell; and
   the second load impedance is associated with the second current-steering cell.

9. The DAC system of claim 1, wherein drains of the first current-steering transistor and the second current-steering transistor are coupled to a resistor-ladder circuit.

10. The DAC system of claim 1, wherein the first current-steering transistor, the second current-steering transistor, the first transistor, and the second transistor comprise p-channel metal-oxide-semiconductor (PMOS) transistors.

11. A method for digital-to-analog conversion, comprising:
   receiving, at a first driver of a digital-to-analog converter (DAC), a first digital input via an input path of the DAC;
   generating an analog output signal based on the first digital input by controlling, via the first driver, a first current-steering transistor and a second current-steering transistor of a first current-steering cell of a plurality of current-steering cells based on the first digital input, the first current-steering cell having a first current source coupled to the first current-steering transistor and the second current-steering transistor, wherein the first current-steering cell further comprises:
      a first transistor having a source coupled to a current source path, a drain coupled to a reference potential node, and a gate coupled to the first driver; and
      a second transistor having a source coupled to the current source path, a drain coupled to the reference potential node, and a gate coupled to the first driver
   receiving, via a third transistor of the current source path, a first current at a source of the third transistor, a drain of the third transistor being coupled to the sources of the first transistor and the second transistor; and providing a second current via a second current source, wherein the first current comprises a first portion of the second current, a second portion of the second current being provided to a second current-steering cell of the plurality of current-steering cells.

12. The method of claim 11, wherein the first current-steering cell further comprises a fourth transistor coupled between the first current source and a current-steering node, the current-steering node being coupled to sources of the first current-steering transistor and the second current-steering transistor.

13. The method of claim 12, wherein a gate of the fourth transistor is coupled to a gate of the third transistor.

14. The method of claim 11, further comprising:
providing, via the first current-steering transistor, a first output current to a first output of the DAC, a drain of the first current-steering transistor being coupled to the first output of the DAC; and
providing, via the second current-steering transistor, a second output current to a second output of the DAC, a drain of the second current-steering transistor being coupled to the second output of the DAC.

15. The method of claim 11, further comprising:
receiving, at a second driver of the DAC, a second digital input via the input path of the DAC; and
generating the analog output signal based on the second digital input by controlling, via the second driver, a third current-steering transistor and a fourth current-steering transistor of a second current-steering cell of the plurality of current-steering cells based on the second digital input, the second current-steering cell having a second current source coupled to the third current-steering transistor and the fourth current-steering transistor.

16. The method of claim 15, wherein the second current-steering cell comprises:
a fifth current-steering transistor having a source coupled to the second current source; and
a sixth current-steering transistor having a source coupled to the second current source, wherein a gate of the fifth current-steering transistor and a gate of the sixth current-steering transistor are coupled to a first output and a second output of the second driver, respectively.

17. The method of claim 15, wherein the first digital input has a lower significance than the second digital input.

18. The method of claim 15, wherein:
a first load impedance for the first driver is configured to match a second load impedance for the second driver;
the first load impedance is associated with the first current-steering cell; and
the second load impedance is associated with the second current-steering cell.

19. The method of claim 11, wherein drains of the first current-steering transistor and the second current-steering transistor are coupled to a resistor-ladder circuit.

20. The method of claim 11, wherein the first current-steering transistor, the second current-steering transistor, the first transistor, and the second transistor comprise p-channel metal-oxide-semiconductor (PMOS) transistors.

\* \* \* \* \*